(12) United States Patent
Liu et al.

(10) Patent No.: US 10,418,460 B2
(45) Date of Patent: Sep. 17, 2019

(54) DUMMY GATE STRUCTURE AND METHODS THEREOF

(71) Applicant: Taiwan Semiconductor Manufacturing Company, Ltd., Hsin-Chu (TW)

(72) Inventors: Chia-Chu Liu, Shin-Chu (TW); Kuei-Shun Chen, Hsinchu (TW); Chiang Mu-Chi, Hsinchu (TW); Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/954,104

(22) Filed: Apr. 16, 2018

(65) Prior Publication Data
US 2018/0233582 A1 Aug. 16, 2018

Related U.S. Application Data

(60) Continuation of application No. 15/250,023, filed on Aug. 29, 2016, now Pat. No. 9,947,764, which is a
(Continued)

(51) Int. Cl.
*H01L 29/66* (2006.01)
*H01L 29/78* (2006.01)
(Continued)

(52) U.S. Cl.
CPC .......... *H01L 29/66545* (2013.01); *H01L 21/823431* (2013.01); *H01L 21/823437* (2013.01); *H01L 21/823481* (2013.01); *H01L 29/0649* (2013.01); *H01L 29/0847* (2013.01); *H01L 29/66795* (2013.01); *H01L 29/785* (2013.01); *H01L 29/7856* (2013.01)

(58) Field of Classification Search
None
See application file for complete search history.

(56) References Cited

U.S. PATENT DOCUMENTS 7,785,946 B2 8/2010 Haffner et al.
8,669,621 B2 3/2014 Yamada et al.
(Continued)

FOREIGN PATENT DOCUMENTS

TW 201332021 A 8/2013

*Primary Examiner* — Whitney Moore
(74) *Attorney, Agent, or Firm* — Haynes and Boone, LLP

(57) ABSTRACT

A structure and method for implementation of dummy gate structures within multi-gate device structures includes a semiconductor device including an isolation region that separates a first and second active region. The first active region is adjacent to a first side of the isolation region and the second active region is adjacent to a second side of the isolation region. A device including a source, a drain, and a gate is formed within the first active region. One of the source and drain regions are disposed adjacent to the isolation region. A dummy gate is formed at least partially over the isolation region and adjacent to the one of the source and drain regions. In various examples, the gate includes a first dielectric layer having a first thickness and the dummy gate includes a second dielectric layer having a second thickness greater than the first thickness.

20 Claims, 15 Drawing Sheets

Related U.S. Application Data division of application No. 14/499,949, filed on Sep. 29, 2014, now Pat. No. 9,431,513.

(51) Int. Cl.
*H01L 21/8234* (2006.01)
*H01L 29/06* (2006.01)
*H01L 29/08* (2006.01)

(56) References Cited

U.S. PATENT DOCUMENTS

| | | |
|---|---|---|
| 9,324,866 B2 | 4/2016 | Yu et al. |
| 9,673,328 B2 | 6/2017 | Yu et al. |
| 2009/0079005 A1* | 3/2009 | Haffner ............ H01L 21/28123 257/368 |
| 2010/0038705 A1 | 2/2010 | Doris et al. |
| 2013/0093023 A1* | 4/2013 | Yamada ............ H01L 21/8249 257/378 |

* cited by examiner

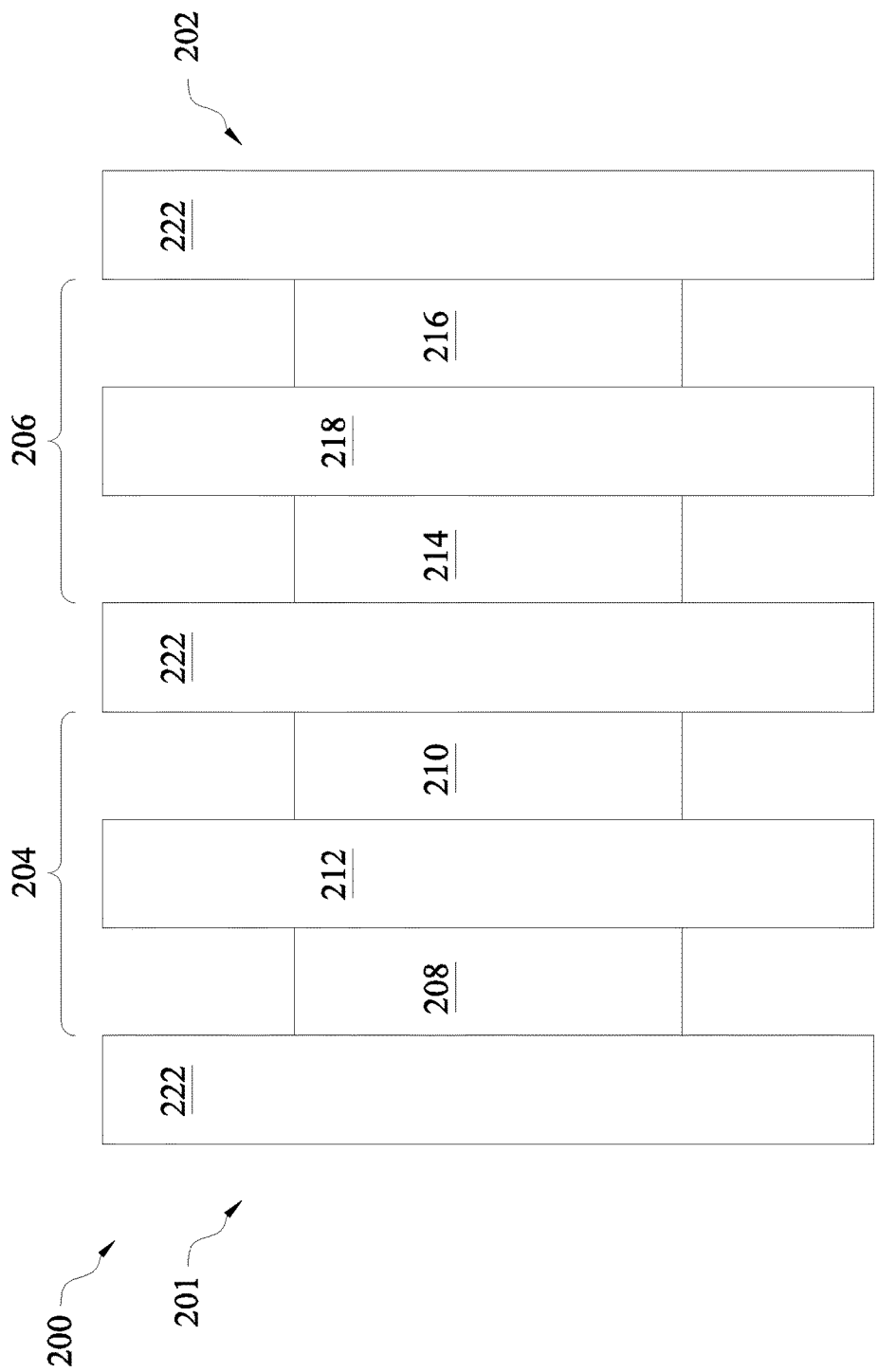

DUMMY GATE STRUCTURE AND METHODS THEREOF

PRIORITY DATA

The present application is a continuation patent application of U.S. patent application Ser. No. 15/250,023 filed on Aug. 29, 2016, which will issue as U.S. Pat. No. 9,947,764, which is a divisional patent application of U.S. patent application Ser. No. 14/499,949 filed on Sep. 29, 2014, now U.S. Pat. No. 9,431,513, the disclosures of which are hereby incorporated by reference in their entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. During the fabrication of advanced semiconductor devices, such as FinFETs, dummy structures (i.e., structures with no electrical function) may be used, for example, to provide a uniform processing environment (e.g., a uniform topography) across a wafer surface. Alternatively, in some examples, such dummy structures may be used as part of a "gate-last" process, where an active gate structure replaces a dummy gate structure at a late stage of a semiconductor device fabrication process. The integration of dummy structures with advanced transistor devices (e.g., FinFET devices), in particular as transistor devices have continued to be aggressively scaled down, has introduced considerable new challenges. In short, existing semiconductor fabrication techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B illustrate a top-view and a cross-sectional view, respectively, of a device structure including a first and second multi-gate device with a dummy gate disposed therebetween;

DETAILED DESCRIPTION

Figure 1A:
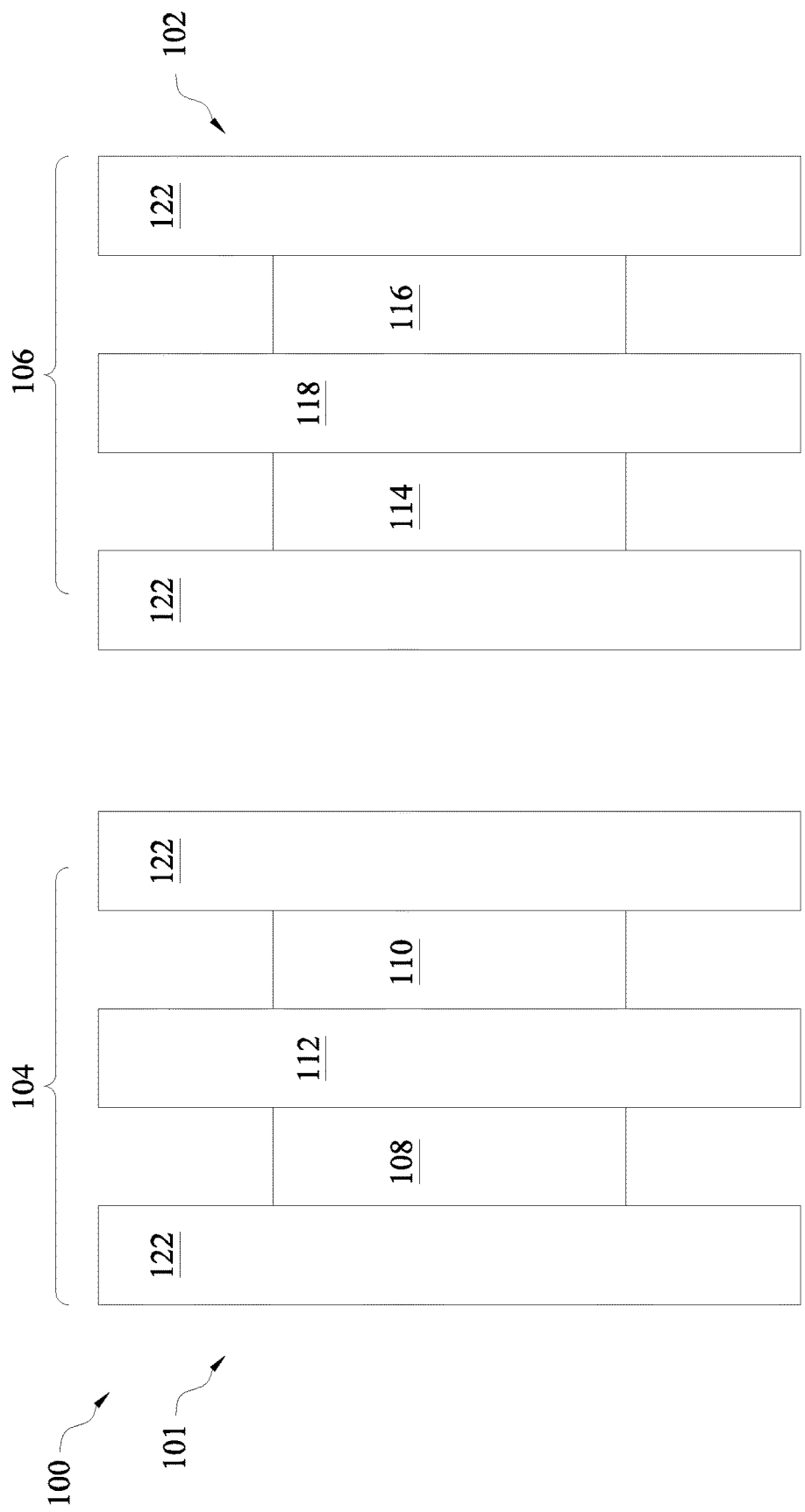
FIGS. 1A and 1B illustrate a top-view and a cross-sectional view, respectively, of a device structure including a first and second multi-gate device with a plurality of dummy gates disposed therebetween.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Figure 1B:
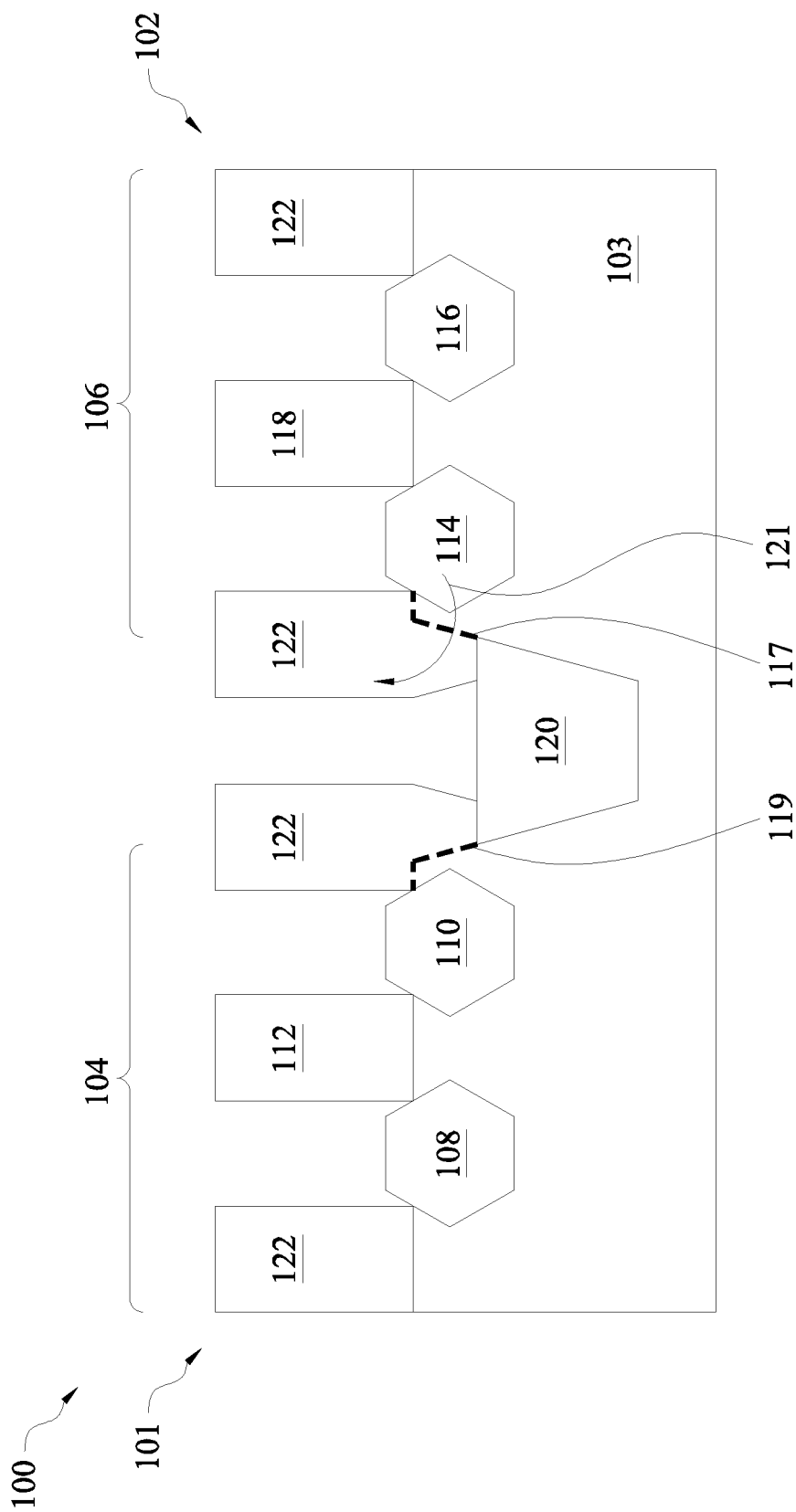

Illustrated in FIGS. 1A and 1B are a top-view and a cross-sectional view, respectively, of a device structure 100 including a first multi-gate device 101 and a second multi-gate device 102 fabricated on a substrate 103 (e.g., a silicon substrate). In some examples, each of the first and second multi-gate devices 101, 102 may include FinFET devices. The device structure 100 is briefly described, with reference to FIGS. 1A/1B, for the purpose of providing context and clarity to the discussion that follows. In various examples, the first multi-gate device 101 is fabricated within an active region 104, and the second multi-gate device 102 is fabricated within an active region 106. As used herein, the term "active region" defines a region which does not include an isolation region, such as shallow trench isolation (STI) region 120. Other examples of isolation regions that may be used include a field oxide (FOX) region, a local oxidation of silicon (LOCOS) region, or other type of isolation region as known in the art. Additionally, an "active region" may be used to define a region including a transistor source, drain, and/or gate. For example, the device 101 within the active region 104 includes source/drain regions 108, 110 as well as a gate 112, and the device 102 within the active region 106 includes source/drain regions 114, 116, as well as a gate 118. In the example of FIGS. 1A/1B, the devices 101, 102 are electrically isolated from each other by way of the STI region 120 disposed between the active regions 104, 106.

The device structure 100 may also include a plurality of dummy gate stacks 122. As used herein, a "dummy" structure, such as a dummy gate or dummy gate stack, is to be understood as referring to a structure which is utilized to mimic a physical property of another structure (e.g., such as to mimic the physical dimensions of a channel, a gate, and/or other structure), and which is circuit inoperable (i.e., which is not part of a circuit current flow path) in the final fabricated device. For example, a "dummy gate", as described herein, is understood to mean an electrically non-functional gate. In some examples, use of dummy gates provide a substantially uniform processing environment across a wafer surface, which provides for uniform epitaxial growth profiles (e.g., of source/drain regions 108, 110, 114, 116) regardless of any specific device layout. Alternatively, in some examples, dummy structures may be used as part of a "gate-last" process, where an active gate structure replaces a dummy gate structure at a late stage of a semiconductor device fabrication process. As used herein, the term "active gate" is used to describe a functional gate in finished transistor device. For example, the gates 112, 118 may include dummy gate stacks (e.g., polysilicon dummy gate stacks) that are replaced by active gate structures (e.g., including a high-K/metal gate stack) at a late stage of processing of the device structure 100. However, in some cases, the gates 112, 118 may include active gates (e.g., including a high-K/metal gate stack) that are formed as part of a "gate-first" process, for example, where the gates 112, 118 are formed prior to formation of the source/drain regions.

Conventionally, the dummy gate stacks 122 are fabricated using the same process as that used to fabricate the gates 112, 118. For example, in some cases, the dummy gate stacks 122 may include polysilicon dummy gate stacks fabricated using the same process, and at the same time, as gates 112, 118 which also include polysilicon dummy gate stacks, which may be replaced at a later stage of processing by a high-K/metal gate stack. In various examples, each of the dummy gate stacks 122 and the gates 112, 118 may include a dielectric layer and an electrode layer disposed over the dielectric layer. By way of example, the dielectric layer may include silicon dioxide, silicon nitride, a high-K dielectric material, or a combination thereof. For the case of polysilicon dummy gate stacks, discussed above, the electrode layer may include a polycrystalline silicon (polysilicon) electrode layer. In accordance with conventional processing techniques, the dielectric layer used for each of the dummy gate stacks 122 and the gates 112, 118 includes a very thin oxide layer having a thickness of around 10-20 Angstroms.

In various examples, a footing region is formed at an interface between an active region and an isolation region. Referring to the example of FIG. 1B, a footing region 117 is formed between the active region 106 and the STI region 120, and a footing region 119 is formed between the active region 104 and the STI region 120. Moreover, in various examples, at least one of the dummy gates 122 is formed over the footing region 117 and/or 119. Considering, as discussed above, that the dummy gates 122 may be formed using the same process as that used to fabricate the gates 112, 118, the thin oxide layer (e.g., around 10-20 Angstroms) of the dummy gate stacks 122 is formed over the footing region 117 and/or 119. In examples including polysilicon dummy gates, a polysilicon electrode layer may overlay the thin oxide layer of the dummy gate stacks 122. While the dummy gates 122 are intended to be electrically non-functional, the thin oxide layer of the dummy gate stacks 122 may not provide sufficient electrical isolation during device operation, and thus a leakage current path (e.g., as indicated by arrow 121) between the source region 114 and the adjacent dummy gate 122 may be available. In some cases, a leakage current path may likewise be available between the drain region 110 and the adjacent dummy gate 122. More generally, a leakage current path may be available between any source/drain region and an adjacent dummy gate 122, where only a thin oxide layer (e.g., around 10-20 Angstroms) is provided as isolation. Such leakage currents, between source/drain regions and neighboring dummy gate stacks, are detrimental to device performance (e.g., such as to devices 101, 102) and reliability. In some cases, one or more dummy gates that are particularly susceptible to leakage current when fabricated according to conventional processing techniques (e.g., such as the dummy gate where the current indicated by arrow 121 is flowing) may be identified as a "critical dummy gate". Various embodiments of the present disclosure are particularly directed toward reducing the leakage current through such "critical dummy gates", as described in more detail below.

Figure 2B:
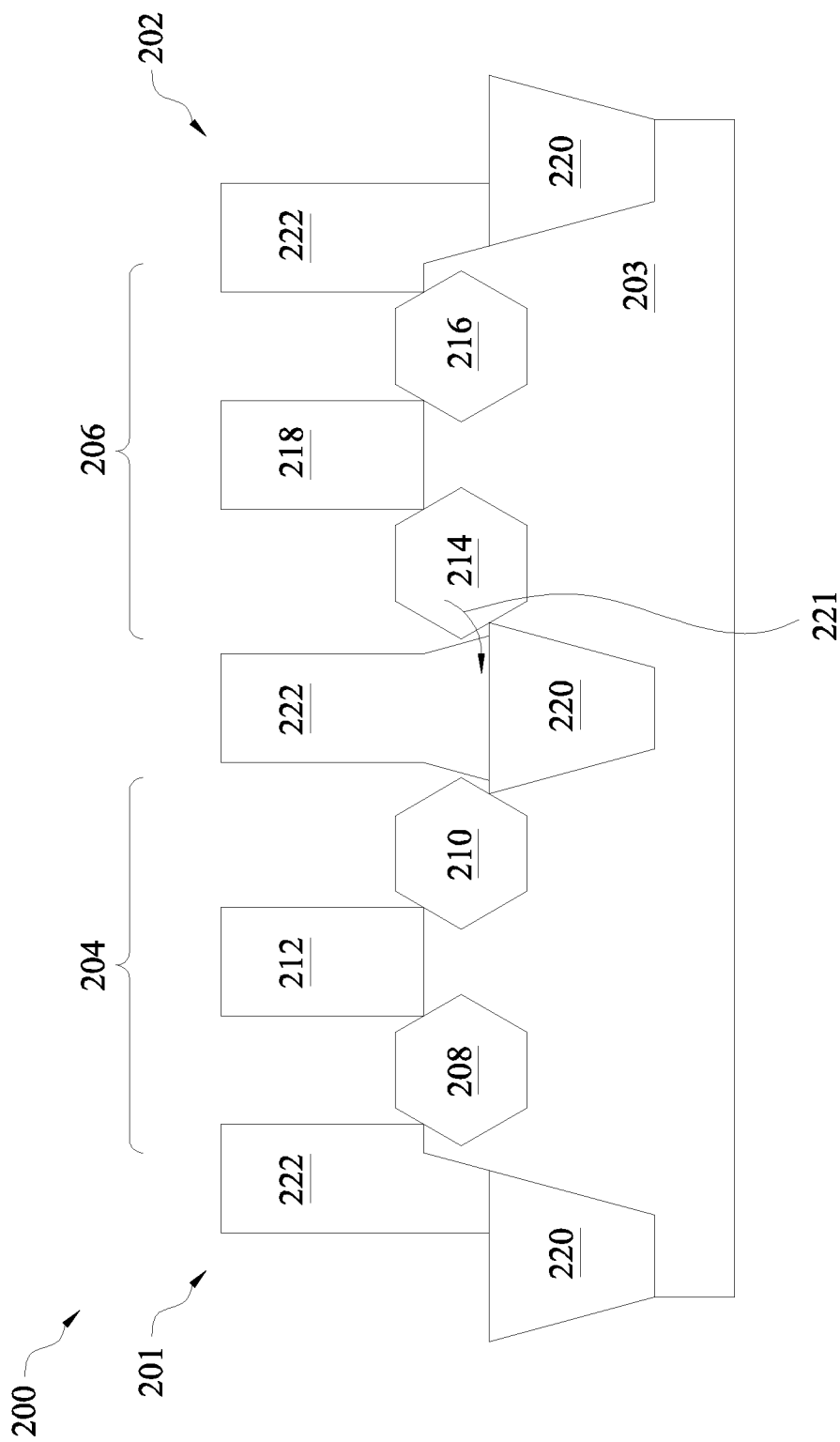

FIGS. 2A and 2B illustrate a top-view and a cross-sectional view, respectively, of a device structure 200 including a first multi-gate device 201 and a second multi-gate device 202 fabricated on a substrate 203 (e.g., a silicon substrate). In some examples, each of the first and second multi-gate devices 201, 202 may include FinFET devices. The device structure 200, including active regions 204, 206, source/drain regions 208, 210, 214, 216, and gates 212, 218, as well as STI regions 220 and dummy gates 222, may be substantially the same as those described above with reference to the device structure 100 of FIGS. 1A/1B. For purposes of clarity of discussion, only the differences are noted herein. For example, while the devices 201, 202 are electrically isolated from each other by way of an STI region 220 disposed between the active regions 204, 206, similar to the example of the STI region 120 in FIG. 1B, only a single dummy gate 222 is formed between the drain region 210 of the device 201 and source region 214 of the device 202. The example of FIGS. 2A/2B may provide for a reduced device footprint, for example, by reducing the spacing between neighboring devices.

Referring to the example of FIG. 2B, a footing region may be formed at an interface between the active region 204 and an adjacent STI region 220, and/or a footing region may formed between the active region 206 and an adjacent STI region 220. In some examples, a footing region may be formed at an interface between the source region 214 and/or the drain region 210, and the STI region 220 interposing the source and drain regions 214, 210. Considering, as discussed above, that the dummy gates 222 may be formed using the same process as that used to fabricate the gates 212, 218, a thin oxide layer (e.g., around 10-20 Angstroms) of the dummy gate stacks 222 may be formed which overlaps such a footing region. While the dummy gates 222 are intended to be electrically non-functional, the thin oxide layer of the dummy gate stacks 222 may not provide sufficient electrical isolation during device operation, and thus a leakage current path (e.g., as indicated by arrow 221) between the source region 214 and the adjacent dummy gate 222 may be available. In some cases, a leakage current path may likewise be available between the drain region 210 and the adjacent dummy gate 222. In some examples, a dummy gate 222 may not explicitly overlap a footing region. However, a leakage current path may nevertheless be available between a source/drain region and an adjacent dummy gate 222 (e.g., as shown by arrow 221), particularly where only a thin oxide layer (e.g., around 10-20 Angstroms) is provided as the dielectric layer of a dummy gate stack. As discussed above, and with reference to FIG. 2B, dummy gates that are particularly susceptible to leakage current when fabricated according to conventional processing techniques (e.g., as indicated by arrow 221) may be identified as critical dummy gates.

As described above, dummy structures (e.g., dummy gates 122, 222) are conventionally used, for example, to provide a uniform processing environment (e.g., for source/drain epitaxy) and/or as part of a "gate-last" process, where an active gate structure replaces a dummy gate structure at a late stage of a semiconductor device fabrication process. The integration of such dummy structures into advanced fabrication processes, and thus into advanced transistor devices (e.g., FinFET devices), has introduced considerable new challenges. At least one such challenge is associated with the use of the same fabrication process to fabricate both the dummy gate structures (e.g., the dummy gate stacks 122, 222) and the gates 112, 118, 212, 218. For example, fabrication of a dummy gate stack having a thin (e.g., around 10-20 Angstroms) dielectric layer, the same as is used for functional gate stacks, can lead to the formation of a leakage current path from a source/drain region to an adjacent dummy gate stack, through the thin dielectric layer of the dummy gate stack. This problem is exacerbated, and thus the leakage current to/from a dummy gate stack may increase, when a dummy gate structure (with its thin dielectric layer) is formed over a footing region, as described above.

Embodiments of the present disclosure offer advantages over the existing art, though it is understood that other embodiments may offer different advantages, not all advantages are necessarily discussed herein, and no particular advantage is required for all embodiments. For example, embodiments discussed herein include dummy gate structures and methods for implementation of dummy gate structures within multi-gate device structures (e.g., FinFET device structures). In some embodiments, a thick gate dielectric (e.g., about 30-50 Angstroms) is used to form one or more "critical dummy gates". In various embodiments, this thick gate dielectric is the same dielectric that is used to form a gate dielectric for input/output (I/O) transistors formed in an I/O region of the substrate. As used herein, critical dummy gates include dummy gates (e.g., a polysilicon dummy gate) which may be susceptible to high leakage currents when fabricated according to conventional processing techniques. Conventional processing techniques may use the same dielectric deposition process to form a thin dielectric layer (e.g., around 10-20 Angstroms) for both gates (which are or will become active gates) and dummy gates simultaneously, which may cause excess leakage current in so-called critical dummy gates. Embodiments of the present disclosure provide for the use of a separate process (i.e., an dielectric deposition process that is used to form a gate dielectric for I/O transistors in an I/O region of the substrate) to form a thick dielectric layer (e.g., around 30-50 Angstroms) for the critical dummy gate, thereby providing enhanced electrical isolation for the critical dummy gate and ensuring that the critical dummy gate remains electrically non-functional during device operation. Those skilled in the art will recognize other benefits and advantages of the methods and devices as described herein, and the embodiments described are not meant to be limiting beyond what is specifically recited in the claims that follow.

Figure 3:
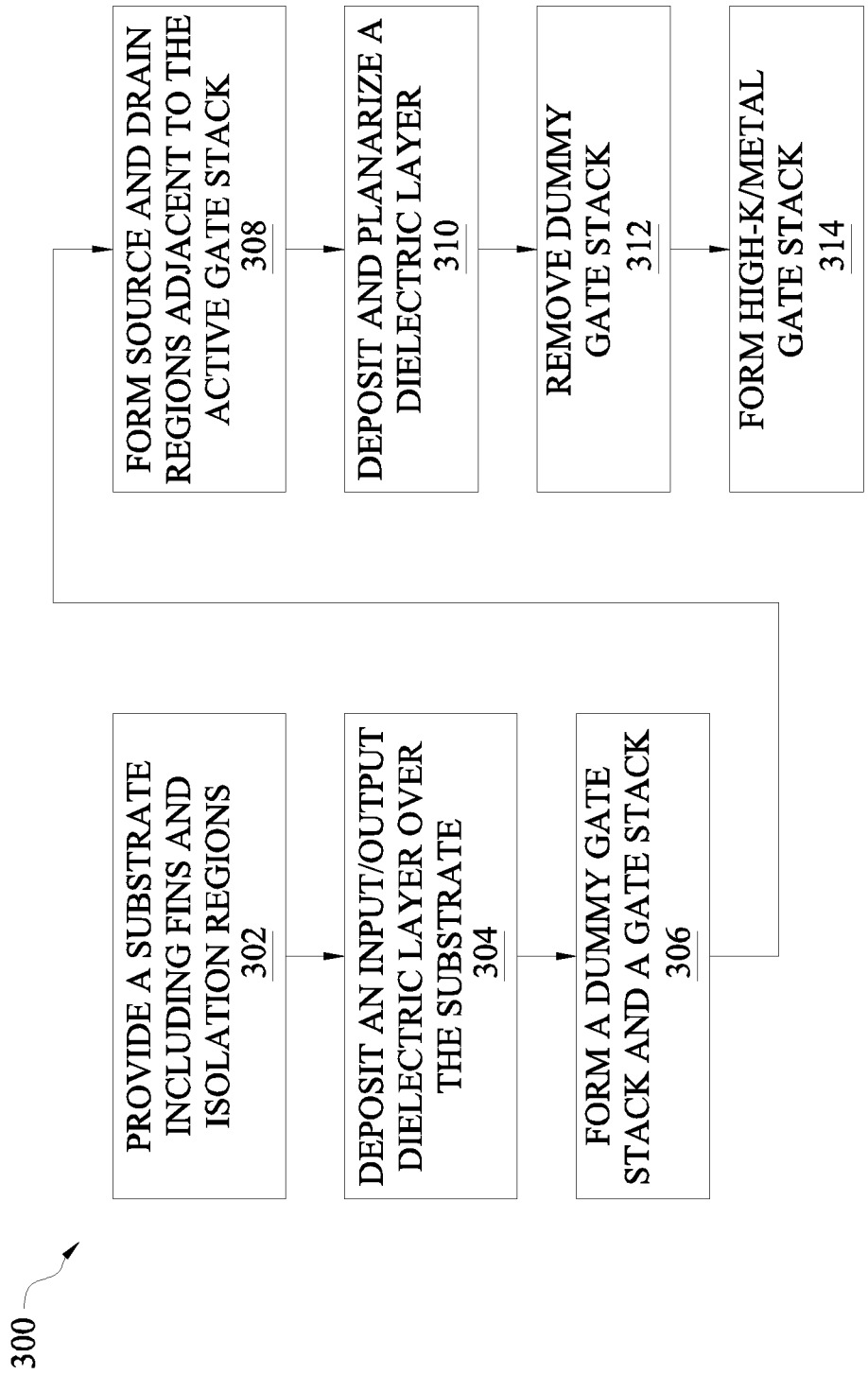
FIG. 3 is a flow chart of a method of fabricating dummy gates within multi-gate device structures, according to one or more aspects of the present disclosure.

Referring now to FIG. 3, illustrated is a method 300 of fabricating dummy gate structures, for example, within a FinFET device. Though described in the context of a FinFET device, it is understood that the method 300 may apply to other structures of transistors including, for example, planar transistors or other multi-gate transistors. In some embodiments, the method 300 may be used to fabricate a semiconductor device structure 400, described below with reference to FIGS. 4A/4B/4C/4D and 5-10. One or more aspects discussed above with reference to the device structures 100, 200 of FIGS. 1A/1B and 2A/2B may also apply to the method 300 and to the device structure 400. Additionally, FIGS. 4A/4B/4C/4D and 5-10 provide top-down and/or cross-sectional views of the exemplary semiconductor device structure 400 fabricated according to one or more steps of the method 300 of FIG. 3.

It is understood that parts of the method 300 and/or the device structure 400 may be fabricated by a well-known complementary metal-oxide-semiconductor (CMOS) technology process flow, and thus some processes are only briefly described herein. Further, the device structure 400 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device structure 400 includes a plurality of semiconductor devices (e.g., transistors), which may be interconnected.

The device structure 400 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Figure 4A:
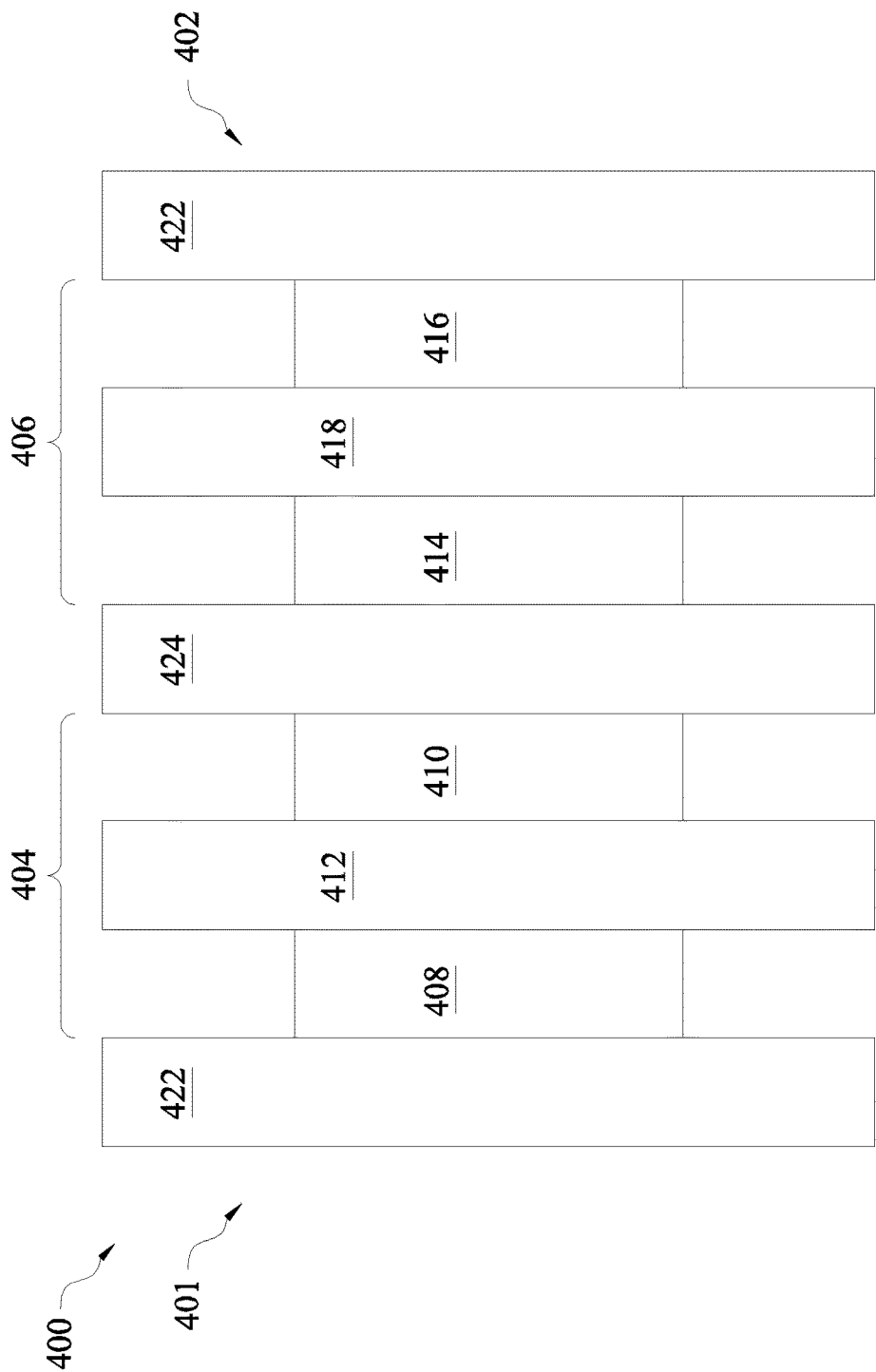
FIGS. 4A and 4B illustrate a top-view and a cross-sectional view, respectively, of a device structure including a first and second multi-gate device with a dummy gate disposed therebetween, according to one or more aspects of the present disclosure.

Prior to discussing the details of the method 300, a semiconductor device structure 400 (illustrated in FIGS. 4A/4B) fabricated in accordance with the method 300 is presented and discussed to provide clarity with regard to one or more of the aspects of the present disclosure. In particular, FIGS. 4A/4B illustrate a top-view and a cross-sectional view, respectively, of the semiconductor device structure 400 including a first multi-gate device 401 and a second multi-gate device 402 fabricated on a substrate 403. In some embodiments, each of the first and second multi-gate devices 401, 402 may include multi-gate devices (e.g., FinFET devices). As shown in FIGS. 4A/4B, portions of the device structure 400 may be similar to one or more aspects of the device structures 100, 200. However, some embodiments of the present disclosure further provide aspects which overcome one or more deficiencies related to the integration of dummy gate structures with advanced semiconductor devices, for example, for device structures processed according to conventional fabrication techniques (e.g., device structures 100, 200). For example, some embodiments of the present disclosure provide structures and methods for substantially reducing and/or eliminating leakage current through "critical dummy gates" (i.e., dummy gates fabricated according to conventional processing techniques that are particularly susceptible to leakage current). As discussed above, for conventional processing techniques, the dummy gates 122, 222 and the gates 112, 118, 212, 218 of the device structures 100, 200 are processed by the same process, resulting in a thin dielectric layer (e.g., around 10-20 Angstroms) for both the dummy gates 122, 222 (where it may not be wanted) and the gates 112, 118, 212, 218 (where it is wanted).

Figure 4B:
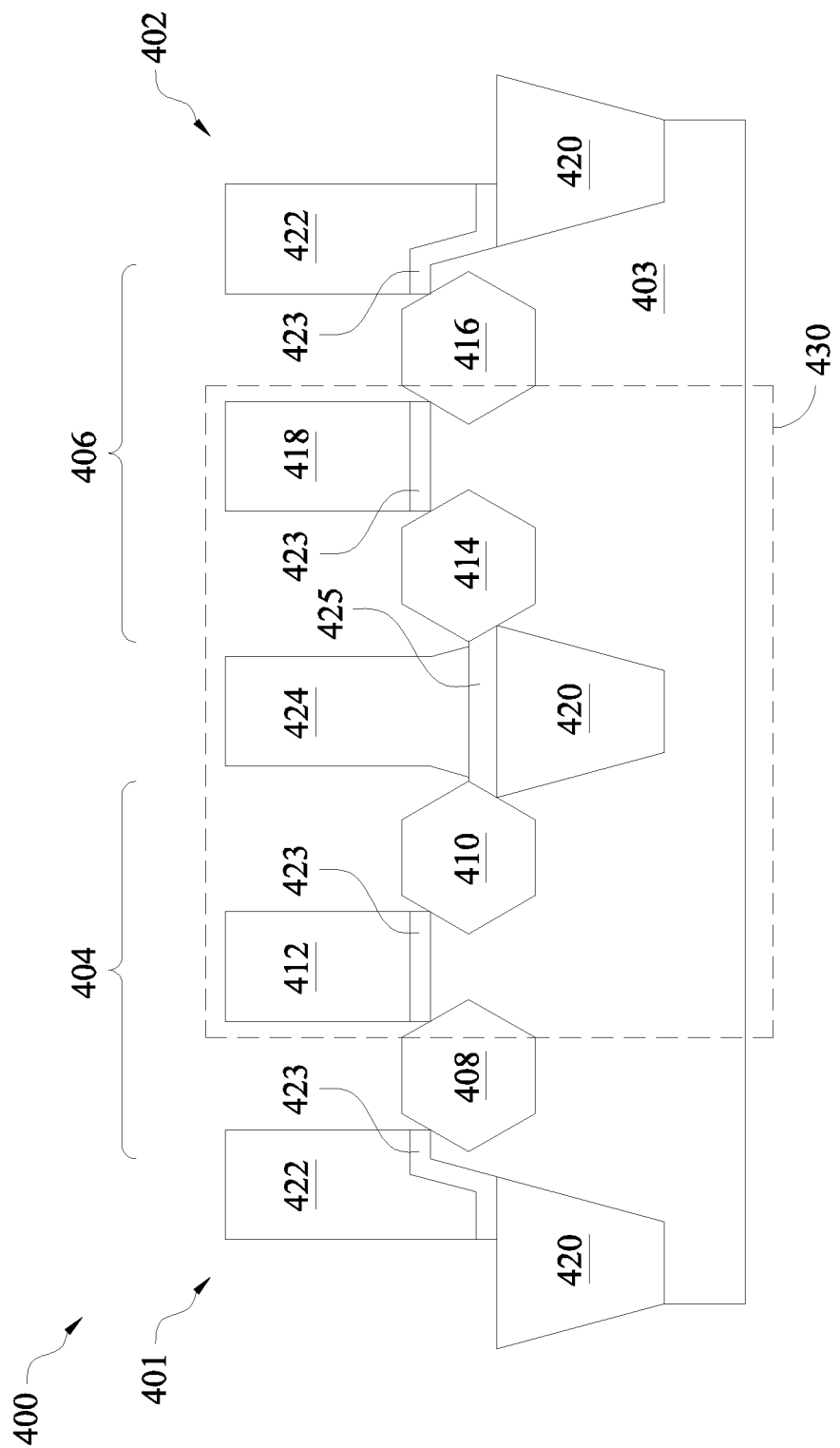
Figure 4C:
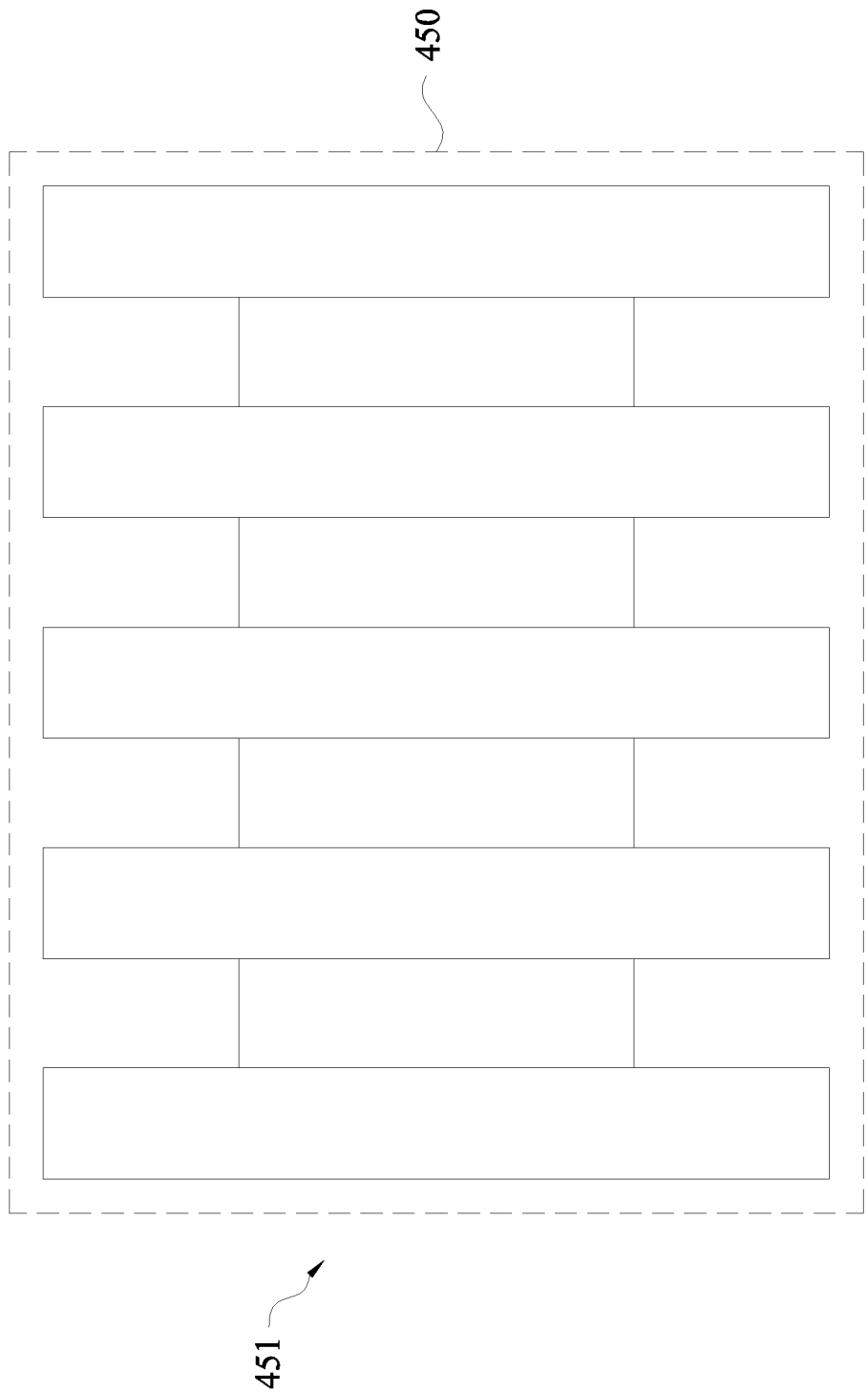
FIGS. 4C and 4D illustrate a top-view and a cross-sectional view, respectively, of an input/output (I/O) device structure formed in an I/O region of a substrate, according to one or more aspects of the present disclosure.
Figure 4D:
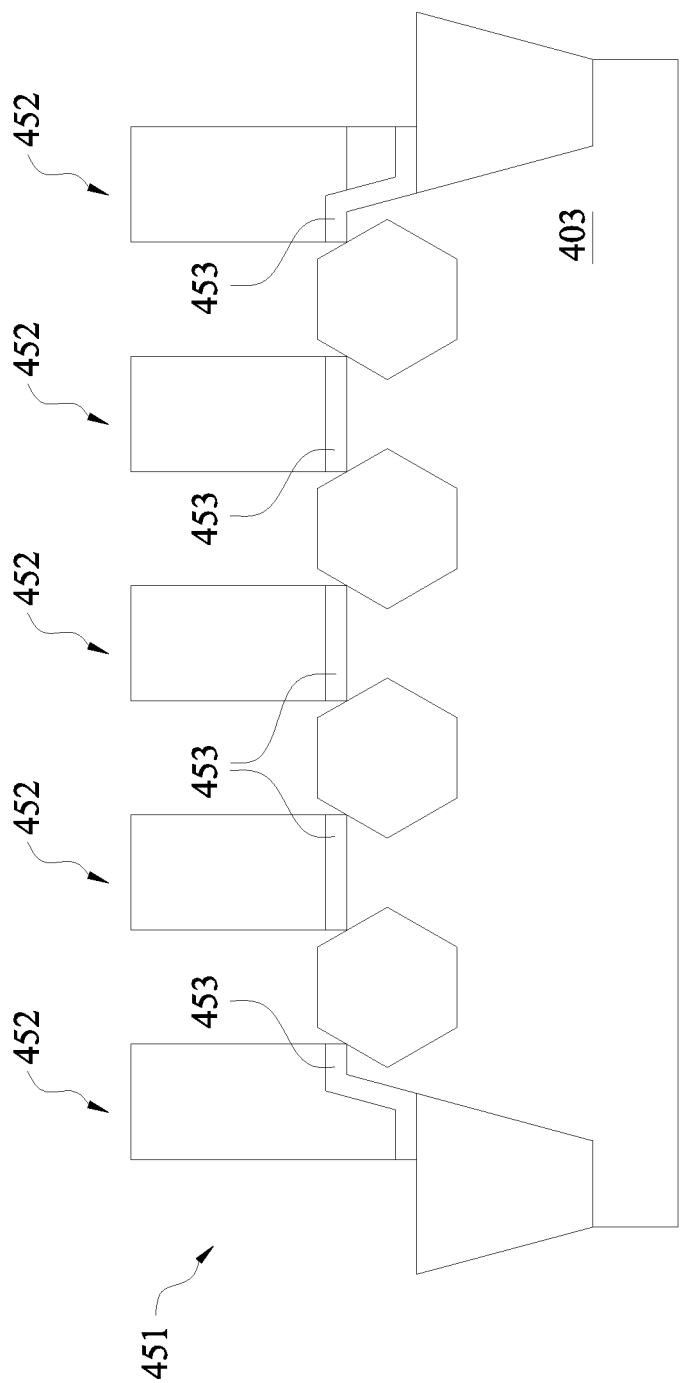

In contrast, embodiments of the present disclosure provide for using a different fabrication process for at least one of the dummy gates (e.g., at least one critical dummy gate), for example, as compared to the fabrication process used for the active gates. In particular, the different fabrication process used for the at least one of the dummy gates provides for a thicker dielectric layer (e.g., around 30-50 Angstroms) as compared to the dielectric layer used for the active gates (e.g., around 10-20 Angstroms). In some embodiments, the different fabrication process used for the at least one of the dummy gates includes the dielectric deposition process that is used to form a gate dielectric as part of a gate stack for I/O transistors in an I/O region of the substrate. With reference to the example of FIGS. 4C/4D, illustrated therein is a top-view and a cross-sectional view, respectively, of an input/output (I/O) device structure formed in an I/O region of a substrate, according to one or more aspects of the present disclosure. By way of example, FIG. 4C shows an I/O device region 450 including a plurality of I/O devices 451 that may be disposed, for example, near a periphery of the semiconductor substrate 403. In various examples, the I/O device region 450 is disposed at a different location of the substrate 403 that the location at which the multi-gate devices 401 and 402 are formed. As is well-known in the art, I/O transistors include gate stacks having a thicker dielectric layer (e.g., about 30-50 Angstroms), as compared to core devices (e.g., multi-gate devices 401, 402), in order to withstand the voltage levels appearing at an I/O transistor gate electrode. Referring to FIGS. 4C/4D, the plurality of I/O devices 451 includes a plurality of gate stacks 452. Moreover, each of the plurality of gate stacks 452 includes a dielectric layer 453, where the dielectric layer 453 is a thick dielectric layer (e.g., around 30-50 Angstroms). In some examples, the dielectric layer 453 may include $SiO_2$. In some embodiments, the I/O transistor dielectric layer may include silicon nitride, a high-K dielectric material, or a combination thereof. In various examples, the dielectric layer 453 is the same as, and is formed simultaneously with, the dielectric layer of a critical dummy gate (e.g., a dielectric layer 425 of the dummy gate 424, discussed below). Thus, the critical dummy gate may include the same dielectric layer material, including the same thickness, as an I/O transistor dielectric layer.

By way of example, and with reference to the embodiments illustrated in FIGS. 4A/4B, a dummy gate stack 424 may be identified as a critical dummy gate (which may be susceptible to leakage current when fabricated according to conventional processing techniques). Thus, in some embodiments, the dummy gate stack 424 may include a thick dielectric layer 425. According to some embodiments, the dielectric layer 425 may be fabricated using the dielectric deposition process that is used to form the gate dielectric 453 for the I/O devices 451 in the I/O region 450 of the substrate 403. Thus, in various embodiments, the dielectric layer 425 may have a thickness of around 30-50 Angstroms. Use of the thicker dielectric layer 425 provides enhanced electrical isolation for the critical dummy gate 424, ensuring that the dummy gate 424 remains electrically non-functional during device operation. In some embodiments, each of the remaining dummy gates 422 (e.g., not identified as "critical dummy gates"), as well as gates 412, 418, may all be fabricated using substantially the same process. Therefore, in some embodiments, both the dummy gates 422 and the gates 412, 418 may include a thin dielectric layer 423, for example, of around 10-20 Angstroms. In some examples more than one dummy gate may be identified as a critical dummy gate, thus more than one dummy gate stack may be fabricated to include the thicker dielectric layer 425. FIG. 4B also illustrates a region 430 of the device structure 400. For purposes of the more detailed discussion of the method 300 that follows, the method 300 is discussed with reference to FIGS. 5-10, which illustrate the region 430 of the device structure 400 at various stages of processing in accordance with one or more steps of the method 300. While only the region 430 is discussed below for clarity in the discussion, it will be understood that one or more of the processes discussed below, and their related structures, may also be applied to fabrication of other portions of the device structure 400 without departing from the scope of the present disclosure.

Figure 5:
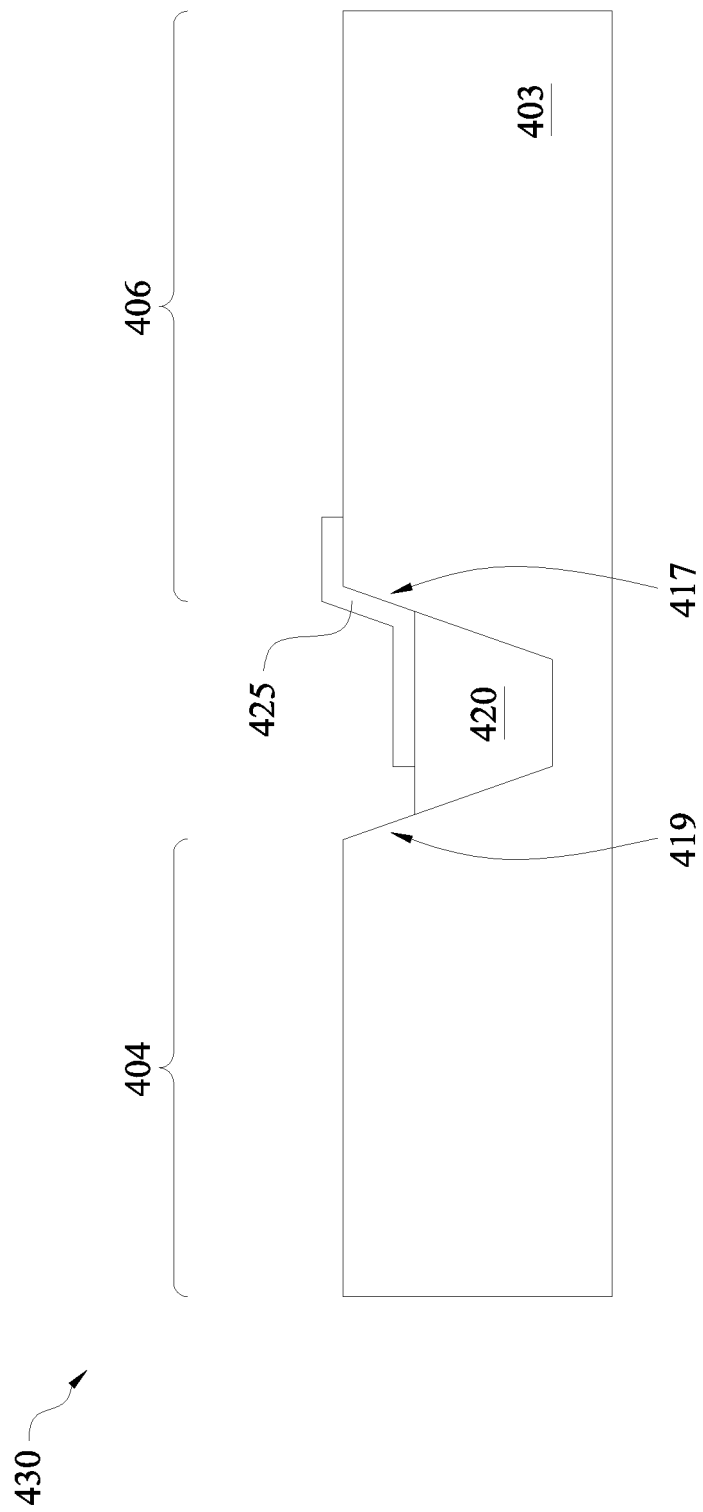
FIG. 5 illustrates a cross-sectional view of a portion of the device of FIG. 4B after a dielectric layer is formed over a footing region, according to some embodiments.

Referring now to the method 300 of FIG. 3, the method 300 begins at block 302 where a substrate including fins and isolation regions is provided. In some embodiments, the substrate also includes at least one footing region, as described above, where the footing region is adjacent to an isolation region. Referring to the example of FIG. 5, illustrated is the region 430 of the device structure 400 including the semiconductor substrate 403. In some embodiments, the substrate 403 includes a fin element, extending from the substrate 403, and an isolation region 420. In some embodiments, the example of FIG. 5 provides a cross-sectional view along an individual fin element extending from the substrate 403. In some embodiments, the substrate 403 may be a semiconductor substrate such as a silicon substrate. In some embodiments, the substrate 403 may include various layers, including conductive or insulating layers formed on a semiconductor substrate. In some examples, the substrate 403 may include various doping configurations depending on design requirements as is known in the art. In some embodiments, the substrate 403 may also include other semiconductors such as germanium, silicon carbide (SiC), silicon germanium (SiGe), or diamond. Alternatively, in some embodiments, the substrate 403 may include a compound semiconductor and/or an alloy semiconductor. Further, in some embodiments, the substrate 403 may include an epitaxial layer (epi-layer), the substrate 403 may be strained for performance enhancement, the substrate 403 may include a silicon-on-insulator (SOI) structure, and/or the substrate 403 may have other suitable enhancement features.

The fin elements, like the substrate 403, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 403 while an etch process forms recesses into the silicon layer, thereby leaving the extending fin elements. The recesses may be etched using a dry etch (e.g., chemical oxide removal), a wet etch, and/or other suitable processes. Numerous other embodiments of methods to form the fin elements on the substrate 403 may also be used.

The isolation region 420 may include a shallow trench isolation (STI) feature. Alternatively, a field oxide, a LOCOS feature, and/or other suitable isolation feature may be implemented on and/or within the substrate 403. The isolation region 420 may be composed of silicon oxide, silicon nitride, silicon oxynitride, fluorine-doped silicate glass (FSG), a low-k dielectric, combinations thereof, and/or other suitable material known in the art. In an embodiment, the isolation region 420 is an STI feature and is formed by etching trenches in the substrate 403. The trenches may then be filled with isolating material, followed by a chemical mechanical polishing (CMP) process to planarize a top surface of the device. However, other embodiments are possible. In some embodiments, the isolation region 420 may include a multi-layer structure, for example, having one or more liner layers.

In some embodiments, prior to the formation of the fin elements, a first dielectric layer may be formed over the substrate 403, and a second dielectric layer may be formed over the first dielectric layer. By way of example, the first dielectric layer may include a pad oxide layer (e.g., $SiO_2$) which may be used as a buffer layer between adjacent layers. In some embodiments, the first dielectric layer includes thermally grown oxide, CVD-deposited oxide, and/or ALD-deposited oxide. In some embodiments, the second dielectric layer includes a pad nitride layer (e.g., $Si_3N_4$), and the second dielectric layer may be deposited by CVD or other suitable technique.

In some embodiments, after formation of the fin elements and formation of the isolation region 420, a well implant may be performed, for example using an ion implantation process and employing a suitable N-type or P-type dopant. Thus, the well implant may be used to form an N- or P-well within the fin elements. In some embodiments the N-type dopant includes arsenic, phosphorous, antimony, or other N-type donor material. In some embodiments, the P-type dopant includes boron, aluminum, gallium, indium, or other P-type acceptor material. In some embodiments, such N- or P-type dopants may be used to form highly-doped source/drain regions and/or or other doped extension and/or well regions. In some embodiments, similar N-type or P-type dopants may be used to perform anti-punch through (APT) ion implantation through the fin elements, for example, to reduce sub-threshold source-to-drain leakage as well as drain-induced barrier lowering (DIBL). In some embodiments, other ion implant processes may also be performed, such as a threshold voltage ($V_t$) adjust implant, a halo implant, or other suitable implant. After an ion implantation process, the semiconductor device structure 400 may be subjected to a high temperature anneal, for example greater than approximately 800° C., in order to remove defects and activate dopants (i.e., to place dopants into substitutional sites). In some examples, the doped regions described above may be formed by one or more of an ion implant process, by thermal diffusion, by doped epitaxial growth, or by another suitable technique.

The example of FIG. 5 also illustrates a footing region 417 formed at an interface between the active region 406 and the isolation region 420 and a footing region 419 formed at an interface between the active region 404 and the isolation region 420. As described above, dummy gates formed using conventional fabrication processes, over or near a footing region (e.g., the footing regions 417, 419), can lead to detrimental leakage current through a thin oxide layer (e.g., around 10-20 Angstroms) and into the dummy gate. Embodiments of the present disclosure provide for a thicker dielectric layer (e.g., around 30-50 Angstroms) to be used for such "critical dummy gates", thus ensuring that the critical dummy gate remains electrically non-functional during device operation. In some embodiments, a critical dummy gate may be formed over and/or near the footing region 417 and/or the footing region 419. For the sake of the discussion that follows, consider that a critical dummy gate (e.g., the dummy gate 424 of FIG. 4A/4B) is to be formed over the footing region 417.

The method 300 then proceeds to block 304 where an input/output (I/O) transistor dielectric layer is deposited over the substrate. In some examples, the I/O transistor dielectric layer (e.g., layer 425) is deposited over at least one footing regions 417, 419. Considering that a dummy gate (e.g., the dummy gate 424) is to be formed over the footing region 417, and still with reference to FIG. 5, a thick dielectric layer 425 (e.g., around 30-50 Angstroms) is formed over the footing region 417. In various embodiments, the thick dielectric layer 425 provides enhanced electrical isolation between the critical dummy gate (e.g., the dummy gate 424) and an adjacent source/drain region (e.g., source region 414). In some embodiments, the thick dielectric layer 425 is formed by patterning (e.g., by a photolithography process) and etching (e.g., using a wet or dry etch) processes to form the dielectric layer 425 over the desired footing region 417. In particular, and by way of example, the thick dielectric layer 425 may be patterned simultaneously and by the same process as that which is used to pattern the dielectric layer 453 formed as part of the plurality of gate stacks 452 for the I/O devices 451. Thus, in some embodiments, the dielectric layer 425 may be the same as the I/O device dielectric layer 453, and may be equivalently referred to as an I/O transistor dielectric layer.

The method 300 proceeds to block 306 where a dummy gate stack and a gate stack are formed. In some embodiments, block 306 may also include forming a plurality of dummy gate stacks, forming a plurality of gate stacks, and forming sidewall spacers disposed on sidewalls of each of the dummy gate stacks and the gate stacks. In some examples of the method 300, one or more of the dummy gate stacks and/or gate stacks may include a high-K/metal gate structure. Referring to the example of FIG. 6, and in an embodiment of block 306, a gate 412 is formed within the active region 404, a gate 418 is formed within the active region 406, and the critical dummy gate 424 is formed over the thick dielectric layer 425. In various embodiments, sidewall spacers 421 are also formed on either side of each of the active and dummy gates. As described above, the critical dummy gate 424 (as well as the remaining dummy gates 422), together with the gates 412, 418, provide a uniform processing environment which beneficially provides for forming uniform epitaxially grown source/drain regions. In some embodiments, the gates 412, 418 are also initially formed as dummy gates (i.e., polysilicon dummy gates), and will be replaced at a later stage of processing by a high-K/metal gate stack.

While embodiments are described herein by way of an exemplary gate-last process, it will be understood that embodiments of the present disclosure are not limited to such a process. In some embodiments, various aspects of the present disclosure may be applicable to a gate-first process. In some examples, a gate-first process includes formation of a gate stack prior to source/drain formation or source/drain dopant activation. Merely by way of example, a gate-first process may include gate dielectric and polysilicon or metal gate depositions, followed by a gate stack etch process to define a gate critical dimension (CD). In some embodiments of a gate-first process, gate stack formation may be followed by source/drain formation including doping of source/drain regions and, in some examples, annealing for source/drain dopant activation.

Considering an embodiment employing a gate-last process, the gates 412, 418 include a dummy gate stack that may be replaced at a later processing stage by a high-K dielectric layer (HK) and metal gate electrode (MG). Similarly, in some embodiments, one or more of the critical dummy gate 424 or remaining dummy gates 422 (FIGS. 4A/4B) may also include a dummy gate stack that may be replaced at a later processing stage by a high-K dielectric layer and metal gate electrode. In the illustrated embodiment of FIG. 6, the gates 412, 418 are formed over the substrate 403 and are at least partially disposed over the fin elements. In some embodiments, the gates 412, 418 include a thin dielectric layer 423 (e.g., about 10-20 Angstroms) and an electrode layer 427. The critical dummy gate 424, as described above, includes a thick dielectric layer 425 (e.g., about 30-50 Angstroms). In some embodiments, a thin dielectric layer, such as the thin dielectric layer 423, may be deposited over the thick dielectric layer 425, followed by forming an electrode layer 429. In some examples, the electrode layer 429 of the critical dummy gate 424 may be formed directly over the thick dielectric layer 425. In various embodiments, a material used for the thick dielectric layer 425 is the same material as that used for the dielectric layer 453 of I/O transistor devices 451. In some embodiments, the material used for each of the thick dielectric layer 425 and the thin dielectric layer 423 may be the same. Also, in some embodiments, a material used for the electrode layer 429 may be the same as a material used for the electrode layer 427.

In some embodiments, the gates 412, 418 and the critical dummy gate 424 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In some embodiments, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE or ICP etching), wet etching, and/or other etching methods. In some examples, after forming the thick dielectric layer 425, fabrication of the remainder of the critical dummy gate 424 and the gates 412, 418 may be performed simultaneously. For example, in embodiments where the dummy gate 424 includes the thin dielectric layer 423 formed over the thick dielectric layer 425, the dielectric layer 423 may be formed simultaneously over each of the gates 412, 418, the dummy gates 422 (FIGS. 4A/4B), and the critical dummy gate 424 (i.e., over the thick dielectric layer 425 which was previously formed by a separate process). In some examples, the thin dielectric layer 423 may be formed only over the gates 412, 418 (and over the remaining dummy gates 422), such that the critical dummy gate 424 does not include the thin dielectric layer 423 formed over the thick dielectric layer 425. In either case, after formation of the dielectric layers 423, 425, the electrode layers 427, 429 of each of the active and dummy gates 412, 418, 424 (as well as the remaining dummy gates 422) may be formed simultaneously. Similarly, in some embodiments, the sidewall spacers 421 of each of the active and dummy gates 412, 418, 422 (FIGS. 4A/4B), and 424 may be formed simultaneously.

In some embodiments, the dielectric layers 423, 425 of the active and dummy gates 412, 418, 422, 424 include silicon oxide. Alternatively or additionally, the dielectric layers 423, 425 may include silicon nitride, a high-K dielectric material or other suitable material. In some embodiments, the electrode layers 427, 429 of the active and dummy gates 412, 418, 422, 424 may include polycrystalline silicon (polysilicon). In some embodiments, a hard mask (e.g., including a dielectric material such as silicon nitride, silicon oxynitride or silicon carbide) may also be formed over the gates 412, 418, the critical dummy gate 424, and/or the remaining dummy gates 422 (FIGS. 4A/4B).

Figure 6:
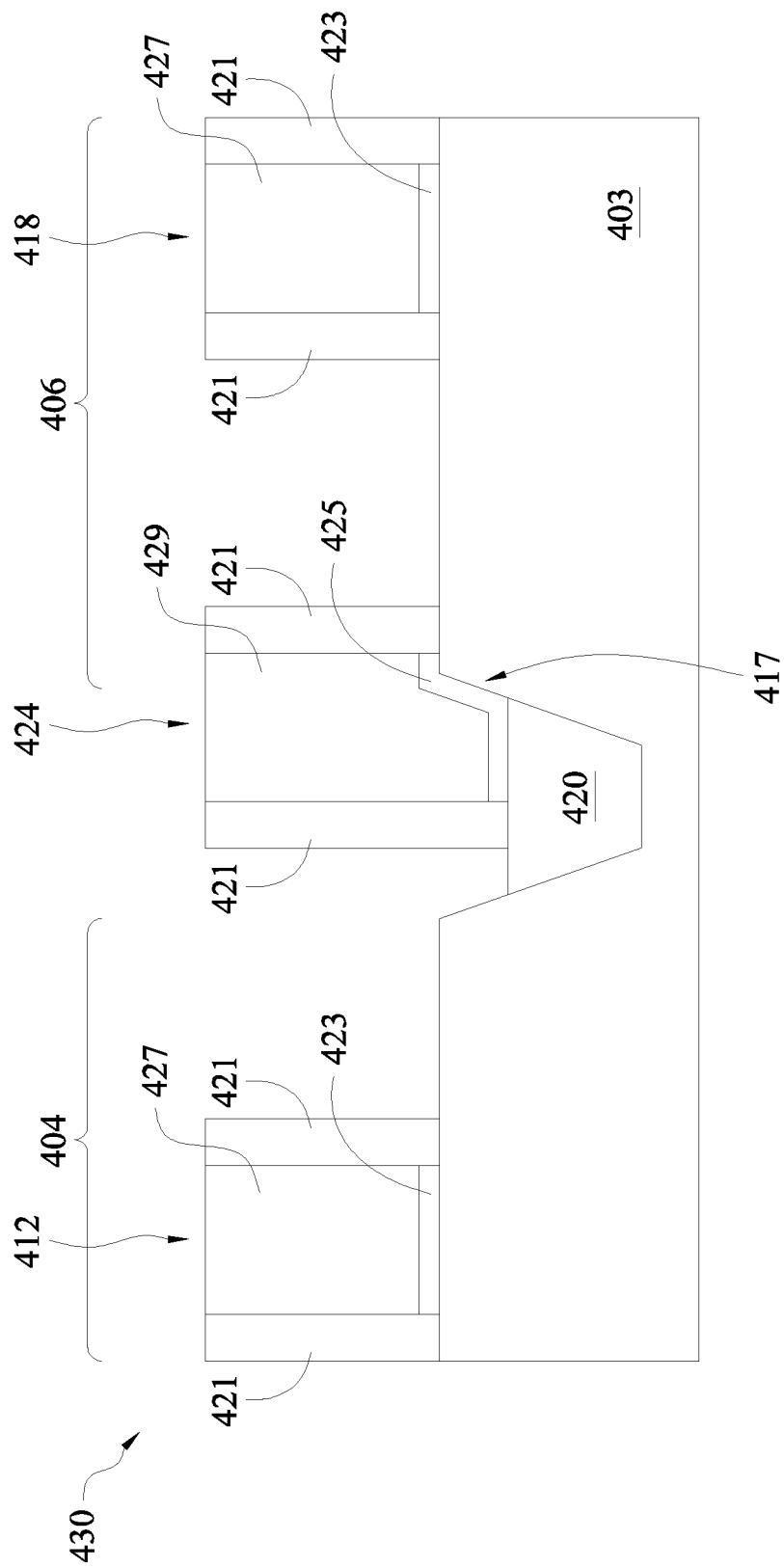
FIG. 6 illustrates a cross-sectional view of a portion of the device of FIG. 4B after formation of a dummy gate and an active gate, according to some embodiments.
Figure 7:
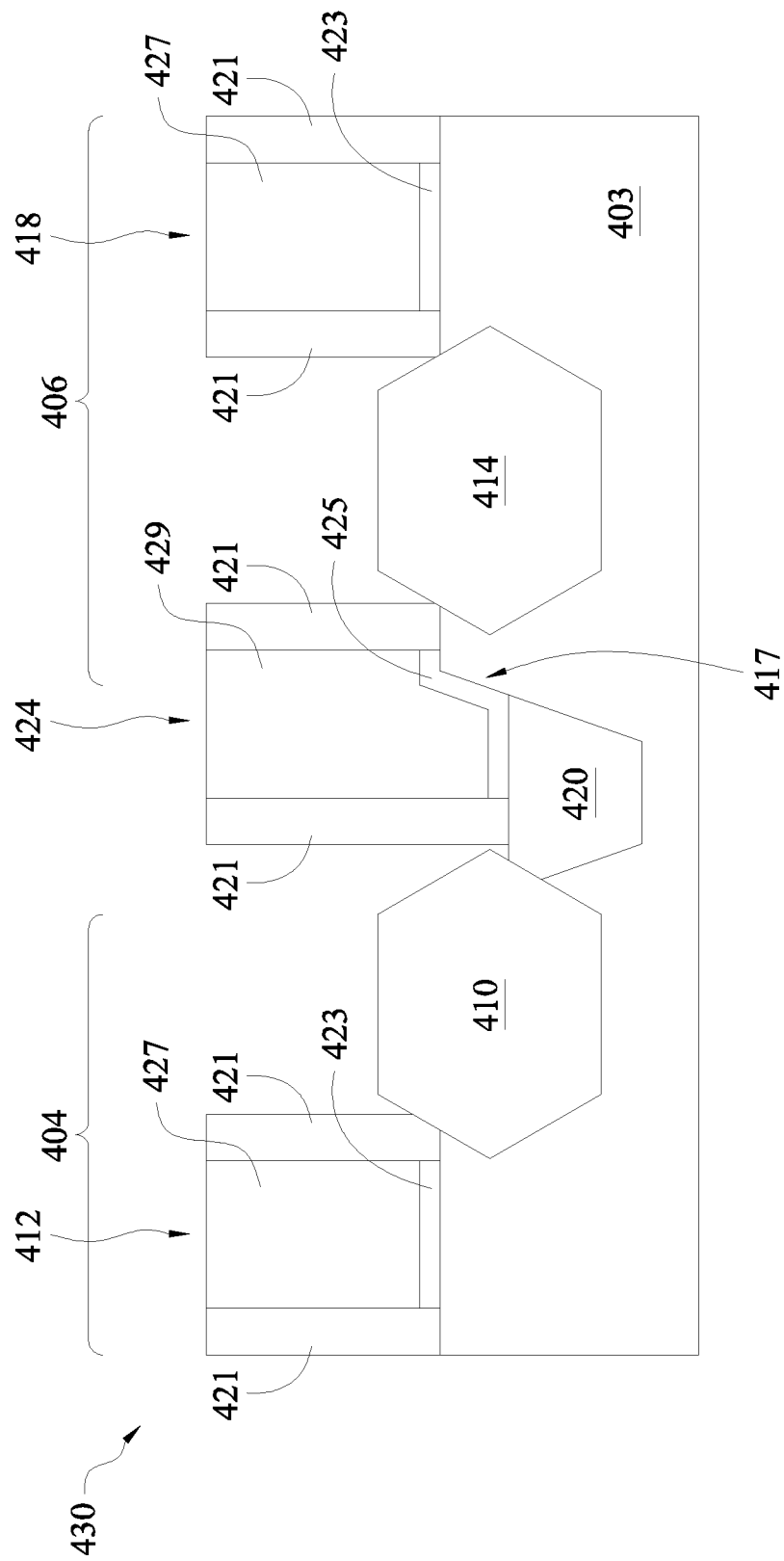
FIG. 7 illustrates a cross-sectional view of a portion of the device of FIG. 4B after formation of a drain feature and a source feature, according to some embodiments.

Still referring to FIG. 6, the sidewall spacers 421 may include a dielectric material such as silicon oxide, silicon nitride, silicon carbide, silicon oxynitride, or combinations thereof. In some embodiments, the sidewall spacers 421 include multiple layers, such as main spacer walls, liner layers, and the like. By way of example, the sidewall spacers 421 may be formed by depositing a dielectric material over the gates 412, 418, the critical dummy gate 424, and/or the remaining dummy gates 422 and anisotropically etching back the dielectric material. In some embodiments, the etch-back process (e.g., for spacer formation) may include a multiple-step etching process to improve etch selectivity and provide over-etch control. In some embodiments, prior to forming the sidewall spacers 421, an ion implantation process may be performed to form lightly-doped drain (LDD) features within the semiconductor device. In some examples, such LDD features may be formed by in-situ doping prior to forming the sidewall spacers 421. In yet other examples, an ion implantation process may be performed after forming the sidewall spacers 421 to form the LDD features. In some embodiments, before or after formation of the sidewall spacers 504, 508, in-situ doping and/or ion implantation may be used to form highly-doped source/drain regions and/or or other doped extension and/or well regions. In some embodiments, after one or more ion implantation processes, the semiconductor device structure 400 may be subject to a high thermal budget process (anneal) to remove defects and activate dopants (i.e., to place dopants into substitutional sites).

Referring again to the method 300, the method 300 proceeds to block 308 where source/drain features are formed in source/drain regions. Referring to the example of FIG. 7, a drain feature 410 of the device 401 (FIGS. 4A/4B) and a source feature 414 of the device 402 (FIGS. 4A/4B) are formed in each of the active regions 404 and 406, respectively. By way of example, the drain and source features 410, 414 (as well as source/drain regions 408, 416 of FIGS. 4A/4B) may be formed in, on, and/or surrounding the fin element extending from the substrate 403. The drain and source features 410, 414 (as well as 408, 416) may be formed by epitaxially growing one or more semiconductor material layers within the active regions 404, 406. In various embodiments, the drain and source features 410, 414 (as well as 408, 416) may be epitaxially grown, where a material used for the drain and source features 410, 414 (as well as 408, 416) may include Ge, Si, GaAs, AlGaAs, SiGe, GaAsP, SiP, or other suitable material. In some embodiments, the drain and source features 410, 414 (as well as 408, 416) may be in-situ doped during the epitaxial growth process. For example, in some embodiments, epitaxially grown SiGe drain and source features 410, 414 (as well as 408, 416) may be doped with boron. In other examples, epitaxially grown Si epi drain and source features 410, 414 (as well as 408, 416) may be doped with carbon to form Si:C, phosphorous to form Si:P, or both carbon and phosphorous to form SiCP. In some embodiments, the drain and source features 410, 414 (as well as 408, 416) are not in-situ doped, and instead an implantation process is performed to dope the drain and source features 410, 414 (as well as 408, 416). In some embodiments, a doping dose used to dope the drain and source features 410, 414 (as well as 408, 416) is greater than a doping dose used to dope the LDD features or other doped extension regions.

In some examples, after forming the source/drain features (block 308), the method 300 proceeds to block 310 where a dielectric layer is deposited and planarized. Referring to the example of FIG. 8, a dielectric layer 431 (e.g., an inter-layer dielectric layer) is formed over the substrate 403. In some embodiments, an etch stop layer (e.g., a contact etch stop layer) may be formed over the substrate 403 prior to formation of the dielectric layer 431. In some embodiments, the dielectric layer 431 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 431 may be deposited by a subatmospheric CVD (SACVD) process, a flowable CVD process, or other suitable deposition technique. In some embodiments, after formation of the dielectric layer 431, the semiconductor device structure 400 may be subject to a high thermal budget process, for example, to anneal the dielectric layer 431.

Figure 8:
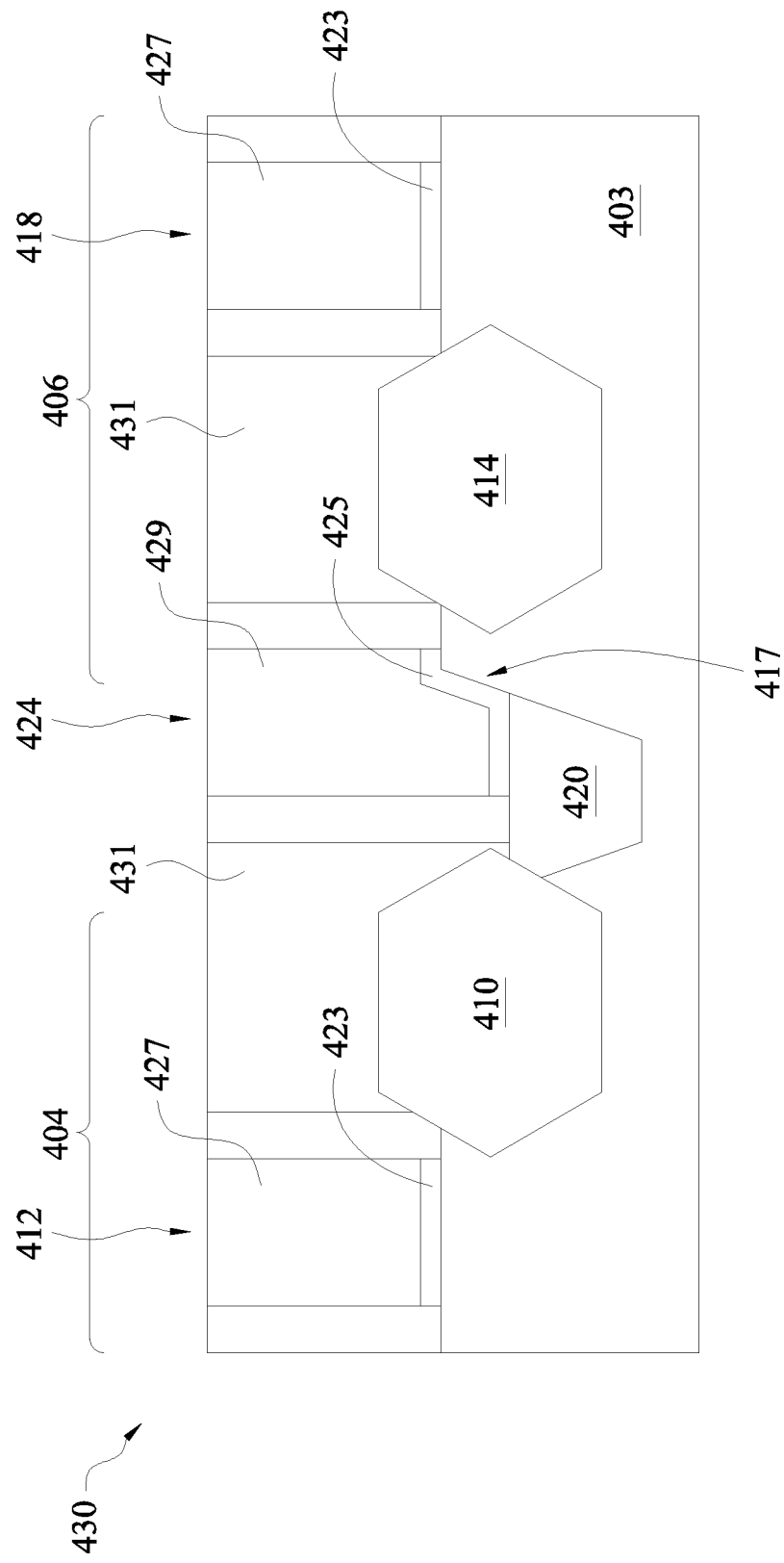
FIG. 8 illustrates a cross-sectional view of a portion of the device of FIG. 4B after formation of a dielectric layer, according to some embodiments.
Figure 9:
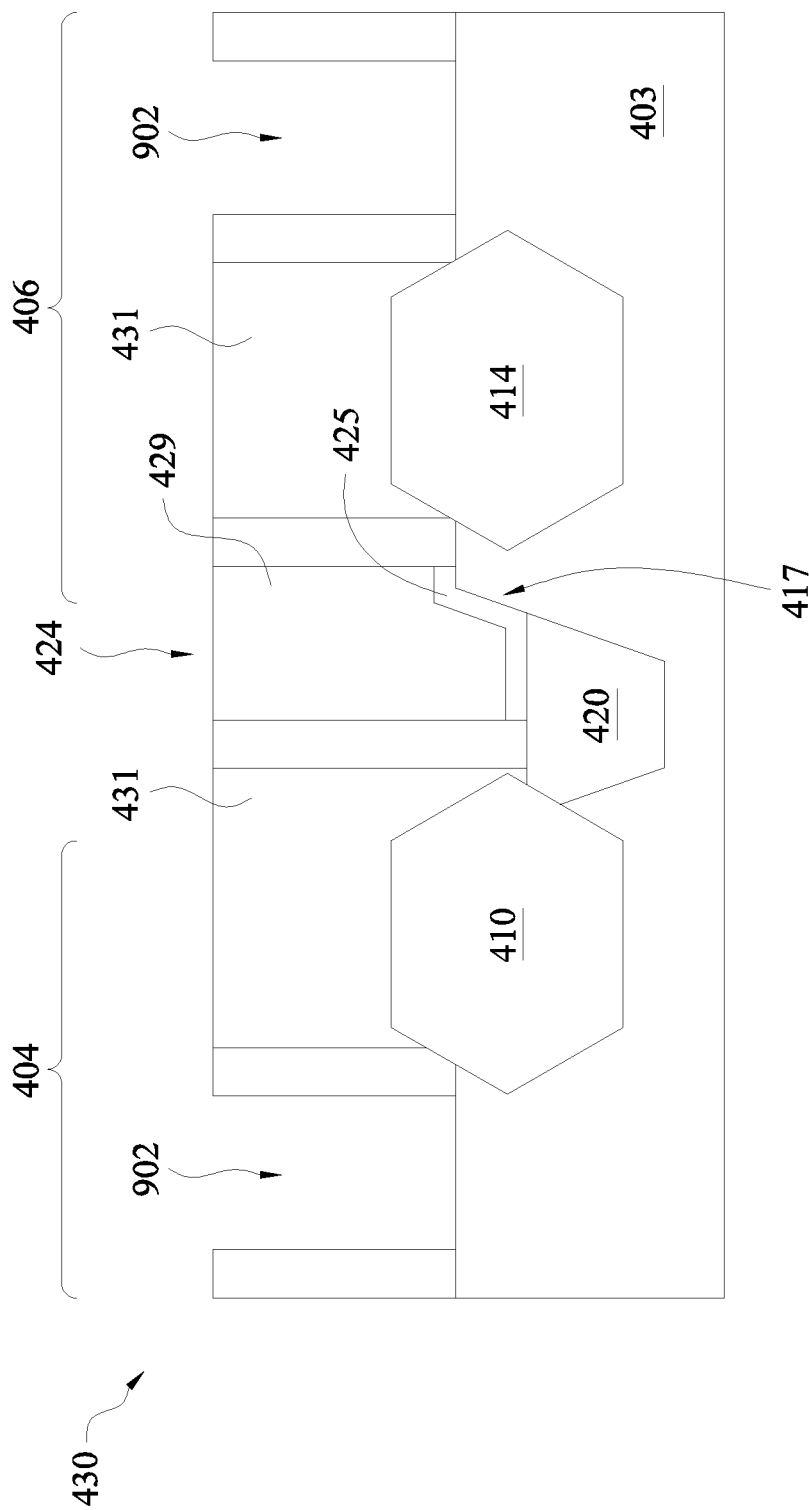
FIG. 9 illustrates a cross-sectional view of a portion of the device of FIG. 4B after removal of one or more dummy gate stack features, according to some embodiments.
Figure 10:
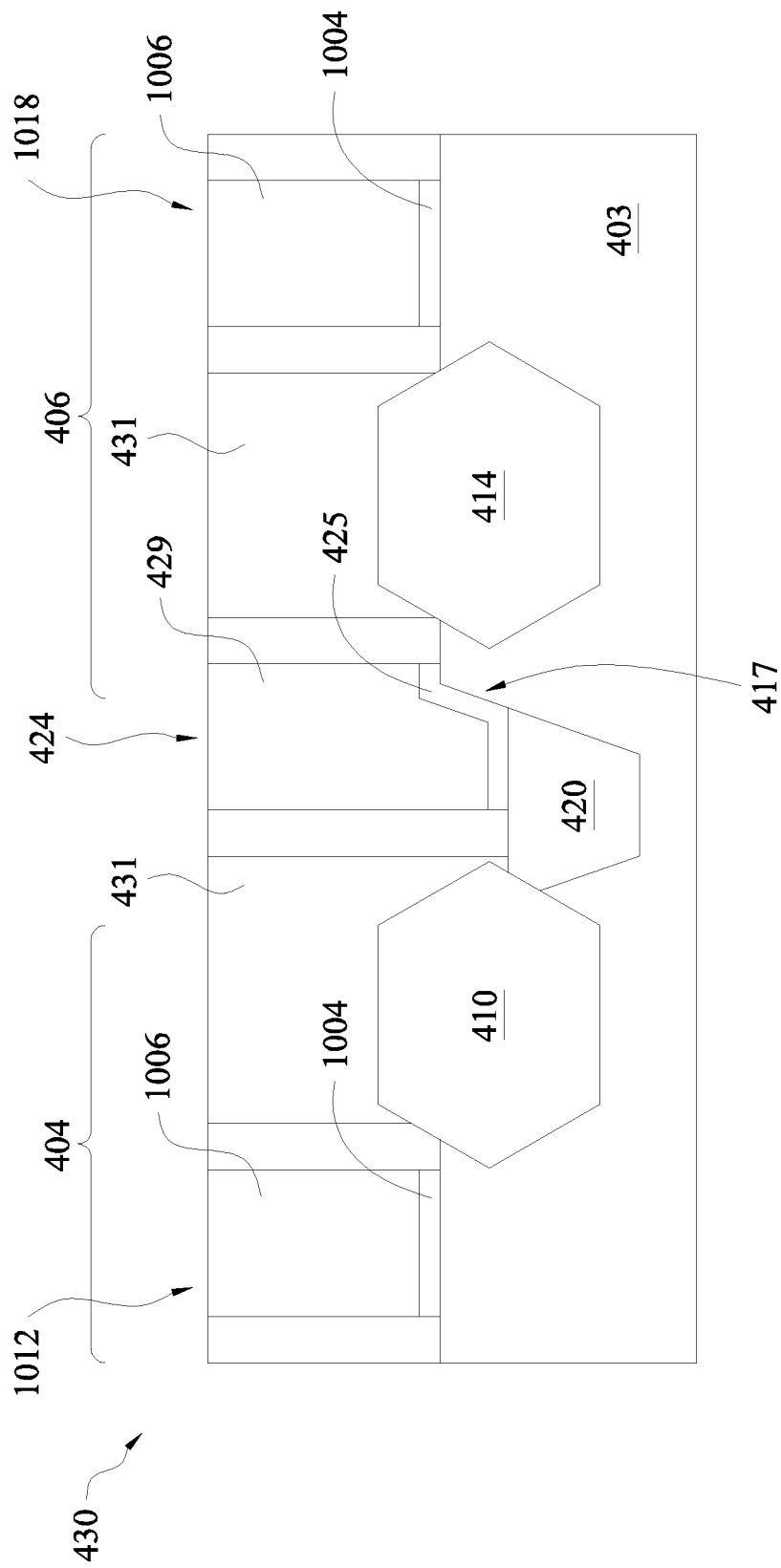
FIG. 10 illustrates a cross-sectional view of a portion of the device of FIG. 4B after formation of a high-K/metal gate stack, according to some embodiments.

In some embodiments, and still referring to FIG. 8, formation of the dielectric layer 431 includes a planarization process (e.g., a CMP process) to expose a top surface of the gates 412, 418, the critical dummy gate 424, and the remaining dummy gates 422 (FIGS. 4A/4B), which may include exposing a top surface of a dummy gate stack (e.g., in a gate-last process). By way of example, the CMP process can be used to remove portions of the dielectric layer 431 overlying the active and dummy gates 412, 418, 422, 424, while also planarizing a top surface of the device structure 400. In embodiments which include a hard mask, the CMP process may also remove the hard mask overlaying the active and dummy gates 412, 418, 422, 424.

In an embodiment, the method 300 then proceeds to block 312 where features of the gates 412, 418 (e.g., dummy gate stack features) are removed from the substrate 403. The removal of the dummy gate stack features (e.g., the dielectric layer and/or the electrode layer) from the gates 412, 418 results in a trench, and a final gate stack (e.g., including a high-K dielectric layer and metal gate electrode) may be subsequently formed in the trench. The removal of the dummy gate stack features may include a selective etch process including a selective wet etch or a selective dry etch. Referring to the examples of FIGS. 8 and 9, the gates 412, 418 include dummy gate stack features which may include the dielectric layer 423 and the electrode layer 427, which are removed from the substrate 403, resulting in a trench 902. The trench 902 may define a region in which the final gate structure can be formed, as described in further detail below.

The method 300 then proceeds to block 314 where a high-K/metal gate stack is formed. For example, the high-K/metal gate stack may be formed in the trench 902 (FIG. 9) defined by removal of the dummy gate stack features of the gates 412, 418. Referring to the example of FIG. 10, high-K metal gate stacks 1012, 1018 are formed on the device structure 400. In some embodiments, the high-K/metal gate stacks 1012, 1018 may each include a dielectric layer 1004 formed over a channel region of each of the devices formed in the active regions 404, 406, where the channel region is disposed within the fin element, underlying the high-K metal gate stacks 1012, 1018. In some embodiments, the dielectric layer 1004 includes an interfacial layer and a high-K gate dielectric layer formed over the interfacial layer. Additionally, the high-K metal gate stacks 1012, 1018 include a metal layer 1006 formed over the dielectric layer 1004. High-K gate dielectrics, as used and described herein, include dielectric materials having a high dielectric constant, for example, greater than that of thermal silicon oxide (~3.9). The metal layer 1006 used within high-K/metal gate stacks 1012, 1018 may include a metal, metal alloy, or metal silicide. Additionally, the formation of the high-K/metal gate stacks 1012, 1018 includes depositions to form various gate materials and one or more CMP processes to remove excessive gate materials and thereby planarize a top surface of the semiconductor device structure 400. For example, again with reference to the example of FIG. 10, a CMP process is performed to remove excess material of the metal layer 1006, to planarize the top surface of the device structure 400, and to complete the formation of the gate stacks 1012, 1018.

In some embodiments, the interfacial layer of the dielectric layer 1004 may include a dielectric material such as silicon oxide ($SiO_2$), HfSiO, or silicon oxynitride (SiON). Such an interfacial layer may be formed by chemical oxidation, thermal oxidation, atomic layer deposition (ALD), chemical vapor deposition (CVD), and/or other suitable method. In some embodiments, the high-K gate dielectric layer of the dielectric layer 1004 may include a high-K dielectric layer such as hafnium oxide ($HfO_2$). Alternatively, the high-K gate dielectric layer of the dielectric layer 1004 of the high-K/metal gate stacks 1012, 1018 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

In some embodiments, the metal layer 1006 of the high-K/metal gate stacks 1012, 1018 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer 1006 of the high-K/metal gate stacks 1012, 1018 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In some embodiments, the metal layer 1006 may include a first metal material for N-type devices and a second metal material for P-type devices. Thus the device structure 400 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin. Similarly, for example, the second metal material (e.g., for P-type devices) may include metals having a work function substantially aligned with a work function of the substrate valence band, or at least substantially aligned with a work function of the valence band of the channel region of the fin. Thus, the metal layer 1006 may provide a gate electrode for the device structure 400, including both N-type and P-type devices. In some embodiments, the metal layer 1006 may alternately include a polysilicon layer. The metal layer 1006 of the high-K/metal gate stacks 1012, 1018 may be formed by ALD, PVD, CVD, e-beam evaporation, or other suitable process. Further, the metal layer 1006 of the high-K/metal gate stacks 1012, 1018 may be formed separately for N-FET and P-FET transistors which may use different metal layers.

The semiconductor device 300 may undergo further processing to form various features and regions known in the art. For example, subsequent processing may form various contacts/vias/lines and multilayers interconnect features (e.g., metal layers and interlayer dielectrics) on the substrate 403, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 300, and some process steps described above may be replaced or eliminated in accordance with various embodiments of the method 300.

The various embodiments described herein offer several advantages over the existing art. It will be understood that not all advantages have been necessarily discussed herein, no particular advantage is required for all embodiments, and other embodiments may offer different advantages. In various examples, embodiments discussed herein include structures and methods for implementation of dummy gate structures within multi-gate device structures (e.g., FinFET device structures). In some embodiments, a thick gate dielectric (e.g., about 30-50 Angstroms) is used to form one or more critical dummy gates, as described above. Critical dummy gates include dummy gates (e.g., a polysilicon dummy gate) which may be susceptible to high leakage currents when fabricated according to conventional processing techniques. Conventional processing techniques may use the same dielectric deposition process to form a thin dielectric layer (e.g., around 10-20 Angstroms) for both gates (which are or will become active gates) and dummy gates simultaneously, which may cause excess leakage current in the critical dummy gates. By contrast, embodiments of the present disclosure provide for the use of a separate process (i.e., the dielectric deposition process that is used to form a gate dielectric 453 for I/O transistors 451 in an I/O region 450 of the substrate 403) to form a thick dielectric layer for the critical dummy gate, thereby providing enhanced electrical isolation for the critical dummy gate and ensuring that the critical dummy gate remains electrically non-functional during device operation.

Thus, one of the embodiments of the present disclosure described a semiconductor device including an isolation region that separates a first active region from a second active region. In some embodiments, the first active region is adjacent to a first side of the isolation region and the second active region is adjacent to a second side of the isolation region. By way of example, a device including a source region, a drain region, and a gate may be formed within the first active region. In some embodiments, the source and drain regions are disposed adjacent to and on either side of the gate and one of the source and drain regions is disposed adjacent to the first side of the isolation region. In various embodiments, a dummy gate is formed at least partially over the isolation region and adjacent to the one of the source and drain regions. The gate includes a first dielectric layer having a first thickness and the dummy gate includes a second dielectric layer having a second thickness that is greater than the first thickness.

In another of the embodiments, discussed is a semiconductor structure including a first active region having a first device including a first source region, a first drain region, and a first gate. The first source region and the first drain region are disposed adjacent to and on either side of the first gate. In some examples, a second active region includes a second device having a second source region, a second drain region, and a second gate. The second source region and the second drain region are disposed adjacent to and on either side of the second gate. In various embodiments, an isolation region is interposed between and adjacent to each of the first and second active regions and a dummy gate is formed over the isolation region. In some embodiments, an input/output (I/O) device including an I/O gate stack is formed within an I/O region of the semiconductor structure. In various embodiments, one of the first source region and the first drain region is disposed adjacent to a first side of the isolation region, and one of the second source region and the second drain region is disposed adjacent to a second side of the isolation region. In addition, in some embodiments, the first and second gates include a first dielectric layer having a first thickness, and the dummy gate and the I/O gate stack include a second dielectric layer having a second thickness greater than the first thickness.

In yet another of the embodiments, discussed is a method of semiconductor device fabrication where an isolation region separating a first active region from a second active region is formed. In some examples, a device is formed within the first active region and includes a source, a drain, and a gate. The gate may include a first dielectric layer having a first thickness, and the source and drain regions may be formed adjacent to and on either side of the gate. In some examples, one of the source and drain regions is formed adjacent to the isolation region. In various embodiments, a second dielectric layer having a second thickness is formed over a footing region at an interface between the first active region and the isolation region. In some examples, the second thickness is greater than the first thickness. Additionally, in some embodiments, while forming the second dielectric layer over the footing region, the second dielectric layer is simultaneously formed over an I/O device region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate including a fin extending therefrom;
   an isolation region adjacent to an active region;
   a device including a source region, a drain region, and a gate formed within the active region, wherein one of the source and drain regions is disposed adjacent to a first side of the isolation region; and
   a dummy gate formed at least partially over the isolation region and adjacent to the one of the source and drain regions;
   wherein the gate includes a first dielectric layer having a first thickness, and wherein the dummy gate includes a second dielectric layer having a second thickness greater than the first thickness,
   wherein the active region includes a first active region, wherein the isolation region separates the first active region from a second active region, wherein the first active region is adjacent to the first side of the isolation region, and wherein the second active region is adjacent to a second side of the isolation region, and
   wherein the first active region includes a first portion of the fin and the second active region includes a second portion of the fin.

2. The semiconductor device of claim 1, wherein the second dielectric layer has a thickness substantially equal to a thickness of a dielectric layer of an input/output (I/O) device gate stack formed within an I/O region of the semiconductor device.

3. The semiconductor device of claim 1, wherein the first dielectric layer has a thickness of around 10-20 Angstroms, and wherein the second dielectric layer has a thickness of around 30-50 Angstroms.

4. The semiconductor device of claim 1, further comprising a first footing region formed at an interface between the first active region and the isolation region, wherein the dummy gate is formed over the first footing region.

5. The semiconductor device of claim 4, further comprising a second footing region formed at an interface between the second active region and the isolation region, wherein the dummy gate is formed over the second footing region.

6. The semiconductor device of claim 4, further comprising a second footing region formed at an interface between the second active region and the isolation region, wherein the dummy gate is formed between the first footing region and the second footing region.

7. The semiconductor device of claim 1, further comprising a plurality of other dummy gates disposed over the fin.

8. The semiconductor device of claim 7, wherein the plurality of other dummy gates includes the first dielectric layer having the first thickness.

9. The semiconductor device of claim 1, wherein the dummy gate includes a polysilicon gate electrode formed over the second dielectric layer.

10. A semiconductor structure, comprising:
    a first active region including a first device having a first source region, a first drain region, and a first gate;
    a second active region including a second device having a second source region, a second drain region, and a second gate;
    an isolation region interposed between and adjacent to each of the first and second active regions and a dummy gate formed over the isolation region;
    an input/output (I/O) device including an I/O gate stack formed within an I/O region of the semiconductor structure; and
    a fin disposed over a substrate, wherein the first active region includes a first portion of the fin and the second active region includes a second portion of the fin, and wherein the first and second gates include a first dielectric layer having a first thickness, and wherein the dummy gate and the I/O gate stack include a second dielectric layer having a second thickness greater than the first thickness.

11. The semiconductor structure of claim 10, wherein one of the first source region and the first drain region is disposed adjacent to a first side of the isolation region, and wherein one of the second source region and the second drain region is disposed adjacent to a second side of the isolation region.

12. The semiconductor structure of claim 10, wherein the first and second gates include a metal gate electrode, and wherein the dummy gate includes a polysilicon gate electrode.

13. The semiconductor structure of claim 10, further comprising:
    a first footing region formed at an interface between the first active region and the isolation region; and
    a second footing region formed at an interface between the second active region and the isolation region;
    wherein the dummy gate is formed at least partially over one of the first footing region and the second footing region.

14. The semiconductor structure of claim 13, further comprising another dummy gate formed at least partially over another footing region formed at an interface between one of the first and second active regions and another isolation region.

15. The semiconductor structure of claim 14, wherein the another dummy gate includes the second dielectric layer having the second thickness greater than the first thickness.

16. A semiconductor device, comprising:
a first isolation region interposing and adjacent to a first active region and a second active region;
a fin disposed over a substrate, wherein the first active region includes a first portion of the fin and the second active region includes a second portion of the fin;
a first gate formed over the first active region;
a second gate formed at least partially over the first isolation region; and
a third gate formed at least partially over a second isolation region;
wherein the first gate and the second gate include a first dielectric layer having a first thickness, and wherein the third gate includes a second dielectric layer having a second thickness greater than the first thickness.

17. The semiconductor device of claim 16, the device further comprising:
an input/output (I/O) device gate formed within an I/O region;
wherein the second dielectric layer has a thickness substantially equal to a thickness of a dielectric layer of the I/O device gate.

18. The semiconductor device of claim 16, wherein the first dielectric layer has a thickness of around 10-20 Angstroms and the second dielectric layer has a thickness of around 30-50 Angstroms.

19. The semiconductor device of claim 16, wherein the fin is formed of a semiconductor material.

20. The semiconductor device of claim 16, further comprising a fourth gate formed over the second active region, the fourth gate having the first dielectric at the first thickness.

* * * * *